United States Patent
Ylilammi et al.

(10) Patent No.: US 11,057,013 B2
(45) Date of Patent: *Jul. 6, 2021

(54) TWO-STAGE LATERAL BULK ACOUSTIC WAVE FILTER

(71) Applicant: VTT Technical Research Centre of Finland Ltd, Espoo (FI)

(72) Inventors: Markku Ylilammi, Espoo (FI); Tapani Makkonen, Espoo (FI); Tuomas Pensala, Espoo (FI)

(73) Assignee: VTT Technical Research Centre of Finland Ltd, Espoo (FI)

( * ) Notice: Subject to any disclaimer, the term of this patent is extended or adjusted under 35 U.S.C. 154(b) by 0 days.

This patent is subject to a terminal disclaimer.

(21) Appl. No.: 16/850,909

(22) Filed: Apr. 16, 2020

(65) Prior Publication Data

US 2020/0244245 A1 Jul. 30, 2020

Related U.S. Application Data

(63) Continuation of application No. 16/125,637, filed on Sep. 7, 2018, now Pat. No. 10,630,256.

(51) Int. Cl.
*H03H 9/02* (2006.01)
*H03H 9/13* (2006.01)
*H03H 9/17* (2006.01)

(52) U.S. Cl.
CPC ....... *H03H 9/02118* (2013.01); *H03H 9/0211* (2013.01); *H03H 9/02015* (2013.01); *H03H 9/132* (2013.01); *H03H 9/173* (2013.01)

(58) Field of Classification Search
CPC .. H03H 9/02118; H03H 9/132; H03H 9/0211; H03H 9/02015; H03H 9/173
USPC ................. 333/133, 186, 187, 188, 193–196
See application file for complete search history.

(56) References Cited

U.S. PATENT DOCUMENTS 9,893,712 B2 2/2018 Meltaus et al.
10,630,256 B2 * 4/2020 Ylilammi ........... H03H 9/02157
(Continued)

FOREIGN PATENT DOCUMENTS

JP H07 131291 5/1995
JP 2002 198776 7/2002
(Continued)

OTHER PUBLICATIONS

Fattinger et al. "Optimization of acoustic dispersion for high performance thin film BAW resonators," Proc. IEEE International Ultrasonics Symposium, 2005, pp. 1175-1178.
Meltaus et al., "Laterally Coupled BAW Filter using Two Acoustic Modes," Proc. IEEE International Ultrasonics Symposium, Jul. 2013, pp. 232-235.
(Continued)

*Primary Examiner* — Robert J Pascal
*Assistant Examiner* — Jorge L Salazar, Jr.
(74) *Attorney, Agent, or Firm* — Fish & Richardson P.C.

(57) ABSTRACT

Acoustic wave filter devices are disclosed. A device includes a layer providing or on a topmost layer of an acoustic reflector. The intermediary layer has a first region and a second region. The first region has a first layer thickness and the second region has a second layer thickness different from the first layer thickness. The device includes a first multilayer stack on the first region and a second multilayer stack on the second region of the intermediary layer. Each of the first and the second stacks includes a piezoelectric layer on a counter electrode that is located on the respective region, an input and an output electrode. Application of a radio frequency voltage between the input electrode and the counter electrode layer of the first stack creates acoustic resonance modes in the piezoelectric layer between the input and output electrodes of the first and the second stack.

20 Claims, 11 Drawing Sheets

(56) References Cited

U.S. PATENT DOCUMENTS

| | | |
|---|---|---|
| 2010/0039000 A1 | 2/2010 | Milson et al. |
| 2013/0057360 A1 | 3/2013 | Meltaus et al. |
| 2014/0312994 A1 | 10/2014 | Meltaus et al. |
| 2015/0002241 A1 | 1/2015 | Taniguchi |

FOREIGN PATENT DOCUMENTS

| | | |
|---|---|---|
| WO | WO 2001/06647 | 1/2001 |
| WO | WO 2011/131844 | 10/2011 |
| WO | WO 2012/049372 | 4/2012 |
| WO | WO 2012/049374 | 4/2012 |
| WO | WO 2013/068652 | 5/2013 |

OTHER PUBLICATIONS

Meltaus et al., "Laterally Coupled BAW Filters with 5% Bandwidth," Proc. IEEE International Ultrasonics Symposium, Oct. 2010, pp. 966-969.

Meltaus et al., "Laterally coupled solidly mounted BAW resonators at 1.9 GHz," Proc. IEEE International Ultrasonics Symposium, Sep. 2009, pp. 847-850.

PCT International Search Report and Written Opinion in International Appln. No. PCT/EP2019/073891, dated Dec. 11, 2019, 14 pages.

Pensala et al., "2-D Modeling of Laterally Acoustically Coupled Thin Film Bulk Acoustic Wave Resonator Filters," IEEE Transactions on ultrasonics, ferroelectrics, and frequency control, Nov. 2010, 57(11):2537-49.

Solie, "Tapered transducers-design and applications," Proc. IEEE International Ultrasonics Symposium, 1998, 1:27-37.

\* cited by examiner

TWO-STAGE LATERAL BULK ACOUSTIC WAVE FILTER

CROSS-REFERENCE TO RELATED APPLICATION

This application is a continuation of and claims priority to U.S. patent application Ser. No. 16/125,637, filed on Sep. 7, 2018. The disclosure of the prior application is considered part of and are incorporated by reference in the disclosure of this application.

BACKGROUND

Technical Field

This specification relates to thin film radio-frequency acoustic wave filters.

Background

Radio-frequency ("RF") components, such as resonators and filters, based on microacoustic and thin-film technology are widely used in radio applications such as: mobile phones, wireless networks, satellite positioning, etc. Their advantages over their lumped-element, ceramic, and electromagnetic counterparts include small size and mass-production capability.

SUMMARY

This specification describes technologies for band pass Lateral Bulk Acoustic Wave ("LBAW") filters. More particularly, the present disclosure provides techniques to suppress sidebands in LBAW filters and improve band pass filter characteristic of LBAW filters.

LBAWs can be used as band pass filters. The band pass filter may include one or more undesired (or parasitic) sidebands. Implementations of the present disclosure provide techniques to suppress the undesired sidebands by cascading two or more LBAWs.

LBAW filters are formed from a piezoelectric layer sandwiched between two pairs of electrodes. One electrode from each pair is located on the top surface of the piezoelectric layer, and forms an input or an output of the LBAW. The input and output electrodes are separated by a gap. Each pair also has a counter electrode located on the bottom surface of the piezoelectric layer. By applying an alternating voltage across the piezoelectric layer at the input resonator, a mechanical resonance is formed in the piezoelectric layer below the input electrode. The piezoelectric layer thickness and the gap between electrodes can be designed such that this mechanical resonance is coupled across the gap to the output resonator. The frequency range at which such coupling occurs determines the achievable bandwidth (or width of passband) for the LBAW filter.

In general, one innovative aspect of the subject matter described in this specification can be embodied in an acoustic wave filter device that includes an acoustic reflector, an intermediary layer providing or on a topmost layer of the acoustic reflector, a first multilayer stack on the acoustic reflector, and a second multilayer stack on the acoustic reflector and adjacent to the first multilayer stack. The intermediary layer has a first region and a second region, the first region having a first layer thickness and the second region having a second layer thickness different from the first layer thickness.

The first multilayer stack includes a first counter electrode on the first region of the intermediary layer, and a first piezoelectric layer on the first counter electrode, and a first input electrode and a first output electrode on the first piezoelectric layer. The first input electrode and the first output electrode each has a first electrode thickness and extends substantially in parallel and separated by a first gap. The second multilayer stack includes a second counter electrode on the second region of the intermediary layer, a second piezoelectric layer on the second counter electrode, and a second input electrode and a second output electrode on the second piezoelectric layer. The second input electrode and the second output electrode each has a second electrode thickness and extends substantially in parallel and separated by a second gap.

The first output electrode is electrically connected to the second input electrode. The first multilayer stack and second multilayer stack are configured such that application of a radio frequency voltage between the first input electrode and the first counter electrode layer creates acoustic modes in the piezoelectric layer between the first input and output electrodes and between the second input and output electrodes. In some examples, application of a radio frequency voltage between the first input electrode and the first counter electrode layer creates acoustic thickness-extensional resonance modes in the piezoelectric layer between the first input and output electrodes and between the second input and output electrodes The foregoing and other embodiments can each optionally include one or more of the following features, alone or in combination.

The second layer thickness can be greater than the first layer thickness. For example, the second layer thickness can be 1% to 10% greater than the first layer thickness.

The radio frequency voltage between the first input electrode and the first counter electrode layer can create second-order acoustic thickness-shear (TS2) resonance mode in the piezoelectric layer between the first input and output electrodes and between the second input and output electrodes. The second layer thickness can be different than the first layer thickness so that a first resonance frequency of TS2 resonance mode created between the first input and output electrodes of the first multilayer stack differs from a second resonance frequency of TS2 resonance mode created between the second input and output electrodes of the second multilayer stack. For example, the first resonance frequency can differ by 1% to 8% from the second resonance frequency. The first resonance frequency can differ from the second resonance frequency by at least 50 MHz.

In some embodiments, the second electrode thickness is greater than the first electrode thickness. In some embodiments, the second electrode thickness is less than the first electrode thickness. For example, the second electrode thickness can be 1% to 10% thinner than the first electrode thickness.

Each of the first input and output electrodes can have multiple first extensions. The multiple first extensions of the first input electrode can be interdigitated with the multiple first extensions of the first output electrode. Each of the second input and output electrodes can have with multiple second extensions. The multiple second extensions of the second input electrode can be interdigitated with the multiple second extensions of the second output electrode. In some examples, each of the first input and output electrodes is a comb structure having the multiple first extensions and each of the second input and output electrodes is a comb structure having the multiple second extensions.

The multiple first extensions can be thicker than the multiple second extensions. For example, the second extension thickness can be 5% to 20% less than the first extension thickness. The second extension thickness can be greater than the first extension thickness so that a first resonance frequency of thickness-extensional (TE1) resonance mode created between the first input and output electrodes of the first multilayer stack is within 1% from a second resonance frequency of TE1 resonance mode created between the second input and output electrodes of the second multilayer stack.

The multiple second extensions can be substantially parallel to the multiple first extensions. The multiple second extensions can form an angle greater than zero with respect to the multiple first extensions.

The acoustic reflector can be a Bragg mirror.

The first output electrode and the second input electrode can be parts of a common electrode shared between the first multilayer stack and the second multilayer stack.

The first output electrode can be connected to the second input electrode through a conductive connector. In some examples, the conductive connector has a length extending parallel to long axis of the extensions of at least one of the first and the second multilayer stacks that is greater than a width of the extensions measured perpendicular to the long axis of the extensions.

The first output electrode can be substantially parallel to the second input electrode.

The subject matter described in this specification can be implemented in particular embodiments so as to realize one or more of the following advantages. Band pass filters described herein can improve the band pass response of LBAW filters, e.g., by suppressing parasitic sidebands. The suppression can be achieved at particular frequencies or over a range of frequencies. In addition, LBAW filters described herein can be simpler to fabricate as compared to conventional acoustic filters because an LBAW uses only a single piezoelectric layer as compared to two vertically stacked bulk acoustic wave (BAW) coupled resonator filters. The LBAW filters can also operate at higher frequencies as compared to surface acoustic wave (SAW) filters because the LBAW filter operation is determined more by piezoelectric layer thickness than interdigital transducer (IDT) electrode dimensions. In some embodiments, LBAW filters can also achieve a wider bandwidth than BAW filters. LBAW filters can perform as filters with a single lithographic patterning step as compared to close to 10 in BAW and can operate without reflectors needed in SAW, and thus in smaller size.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1A:
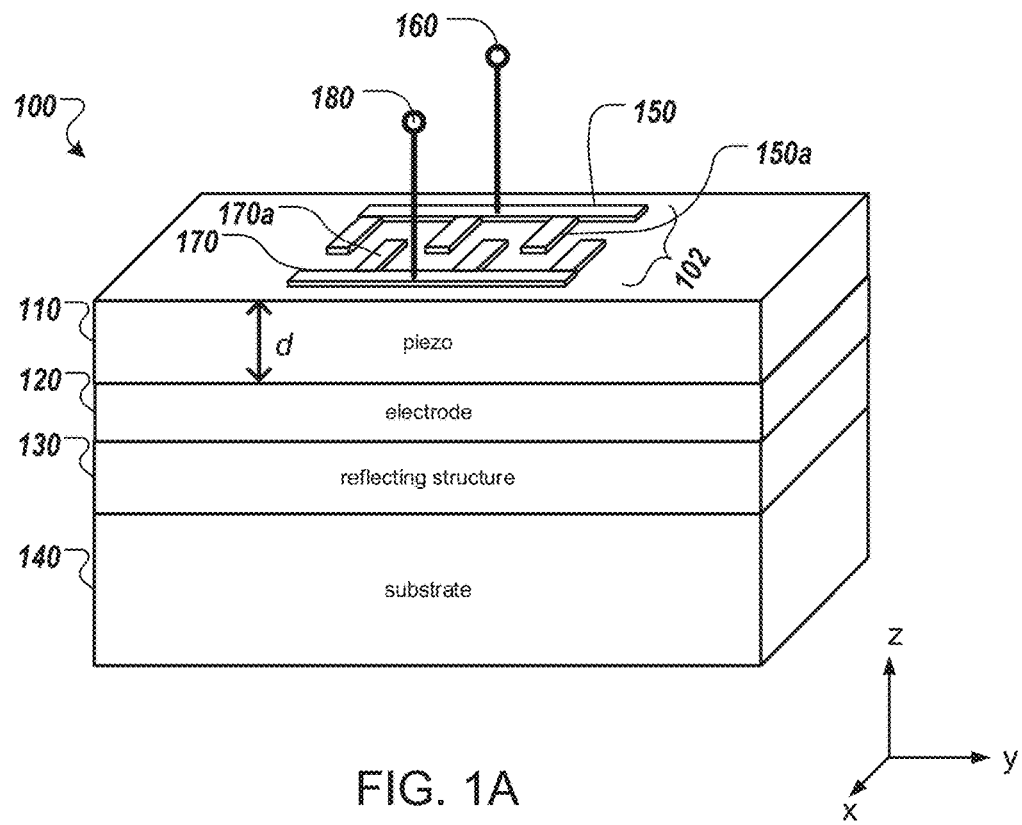
FIG. 1A is a schematic perspective view of a solidly-mounted LBAW filter.
Figure 1B:
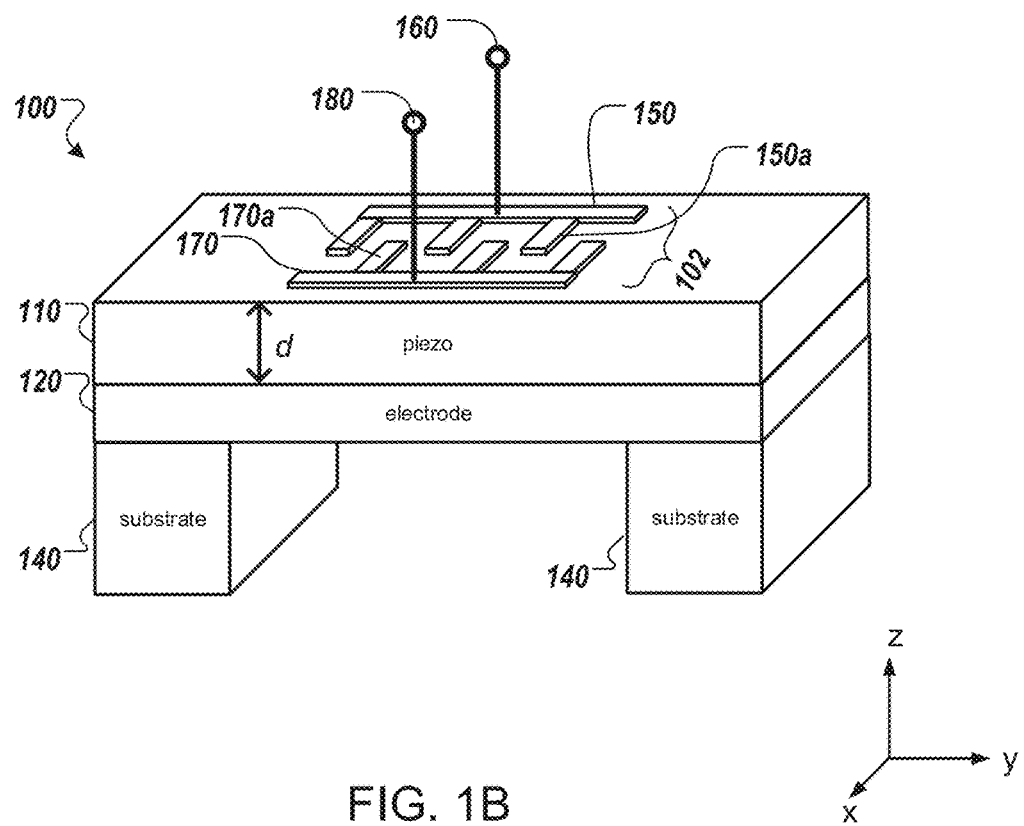
FIG. 1B is a schematic perspective view of a self-supported LBAW filter.
Figure 1C:
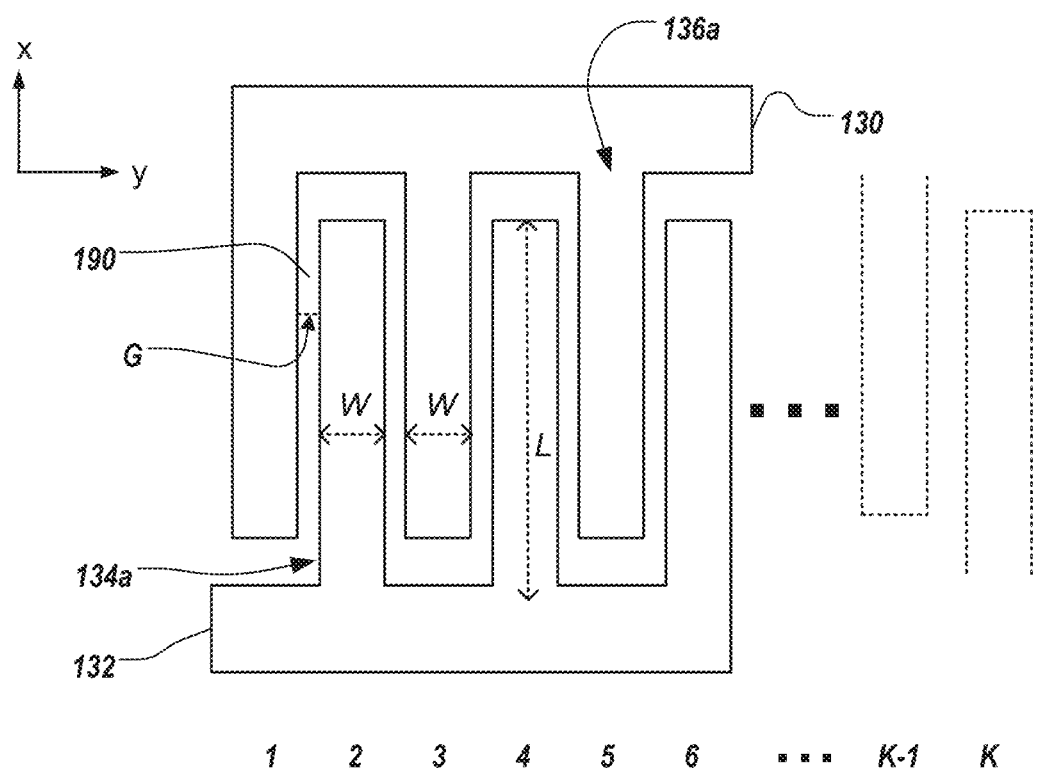
FIG. 1C is a schematic planar view of an IDT electrode structure.

FIGS. 1A, 1C show an example of an LBAW filter (or resonator) 100 with input 150 and output 170 electrodes that have an interdigitated geometry (also called "interdigital transducer" or "IDT" LBAW). LBAW filter 100 includes a piezoelectric ("piezo") layer 110, having a thickness d, an IDT electrode structure 102 located on the top surface of the piezo layer, and a bottom counter electrode 120 located on the bottom surface of the piezo layer. IDT electrode structure ("IDT") 102 includes two comb-shaped electrodes, 150 and 170, of conductive material, e.g., metal or polysilicon. IDT electrodes 150 and 170 have parallel extensions 150a and 170a, respectively, that provide the "tines" or "teeth" or "fingers" of the "comb." Electrode 150 and counter electrode 120 form an input resonator with piezo layer 110. Electrode 170 and counter electrode 120 form an output resonator with piezo layer 110.

Acoustic vibrations are created in piezo layer 110 by applying an oscillating (or alternating) input voltage across IDT electrode 150 and bottom counter electrode 120 at an input port 160. The applied voltage is transformed into a mechanical (e.g., acoustic) vibration via the piezoelectric effect. Under resonance conditions (e.g., with certain acoustic resonance modes, as detailed further below), this vibration can create a standing wave under input electrode 150 and an evanescent wave (with exponentially decaying amplitude) in the gap region 190. With appropriate selection of vibration frequencies and gap width G, the standing wave can be coupled mechanically across gap 190 from the piezo region under electrode 150 to piezo region under electrode 170 by the evanescent wave and create a similar standing wave in piezo layer 110 under electrode 170. The standing wave under electrode 170 results in an output signal voltage with the same frequency at an output port 180 via the reverse piezoelectric effect. The frequency range at which this coupling occurs in mechanical resonance with strong piezoelectric coupling forms the passband (or bandwidth) of LBAW filter 100. In some example, the frequency range is between 1.8 and 1.95 GHz. As discussed further below, the thicknesses and geometries, and spacing of the various layers of LBAW 100 can be tuned to change the RF response and passband of the filter. Throughout this disclosure, width and length are measured along axes parallel to the piezoelectric layer and thickness is measured along the axis perpendicular to the piezoelectric layer.

A reflecting structure 130 can serve to isolate the vibration in piezo layer 110 from an underlying substrate 140 and to prevent acoustic leakage. The reflecting structure can be a stack of thin layers, for example, a Bragg reflector composed of alternating high and low acoustic impedance ("$Z_{ac}$") material layers. The thickness of these layers can be designed such that the frequencies with and near the passband of LBAW filter are reflected back into piezo layer 110 and all other frequencies pass through the mirror.

In some embodiments, LBAW 100 does not directly overlie substrate 140 (as shown in FIG. 1A), but is self-supported, as shown in FIG. 1B. In such an arrangement, substrate 140 and mirror 130 are replaced by an air gap, with portions of piezo that extend laterally past the region in which LBAW 100 is fabricated being supported by substrate 140.

In some embodiments, as shown in FIG. 1C, extensions 150a and 170a are rectangular and have a width W, length L, and are spaced by gap width G. Each electrode 150 and 170 has one or more extensions 150a and 170a respectively. The total number of electrode extensions is designated as K.

Although FIG. 1C shows rectangular interdigital electrodes 150/170 with parallel extensions 150a/170a of same geometry and spacing G, other electrode geometries are also contemplated. Design considerations include the gap between electrodes, the length of the electrode, and the number, if any, and shape of electrode extensions. The gap can be used to control coupling between the input and output electrodes. Longer electrodes can also increase coupling. The number of extensions K can be used to control the bandwidth and/or to increase coupling while conserving the area taken up by the electrodes. In some embodiments, the electrodes are composed of rectangular strips, with two or more extensions (e.g., K≥2). For example, each extension can be a rectangular strip. In some embodiments, the electrodes are concentric circles or spirals having a common axis.

Piezo layer 110 can be formed from various piezoelectric materials. Exemplary materials include ZnO, AlN, CdS, PZT, LiNbO$_3$, LiTaO$_3$, quartz, KNN, BST, GaN, Sc alloyed AlN, or the aforementioned materials doped or alloyed with an additional element. Doping can be used to improve or tailor electromechanical properties of piezo layer 110. As detailed further below, piezo layer thickness d is selected such that thickness-extensional modes near the frequencies of the desired bandwidth of the LBAW filter are produced in the piezo layer. In some embodiments, piezo layer thickness d is 20% to 50% of $\lambda_z$, or 30% to 45% of $\lambda_z$, where $\lambda_z$ is the wavelength of the piezoelectric vibration in the thickness direction. In some embodiments, d is 1500 nm to 2500 nm, or 1800 to 2200 nm.

Thin film IDT 102 can be composed of various materials. In some embodiments, IDT electrodes 150 and 170 are metal. For example, the electrode material can include Al, Mo, Pt, Cu, Au, Ag, Ti, W, Ir, Ru, or multilayers of metals and/or metals doped with additional materials, e.g. AlSi, AlSiCu, polysilicon, etc. Doping can be used to improve or tailor IDT electric or mechanical properties.

Although FIG. 1A shows a single common counter electrode 120, filter 100 can include separate electrodes for the input and output resonators. Various materials are suitable for the counter electrode(s) (e.g., electrode 120). For example, the electrodes can include a metal, such as Al, Mo, Pt, Cu, Au, Ag, Ti, W, Ir, Ru, or multilayers of metals and/or metals doped with additional materials, e.g. AlSi, AlSiCu etc. Doping can be used to improve or tailor IDT electric or mechanical properties. For example, the electrodes can be Ti+Mo, Ti+W, AlN+Mo, or Al+W. The electrodes can be multilayered. The electrodes can have a special thin seed layer deposited below the electrode.

Reflecting structure 130 can be composed of alternating layers of different materials. For example, reflecting structure 130 can include alternating layers of two of: tungsten (W), SiO$_2$, silicon (Si), and carbon (C). For example, layers of high acoustic impedance include W, Mo, Ir, Al$_2$O$_3$, diamond, Pt, AlN, Si$_3$N$_4$. Layers of low acoustic impedance can include SiO$_2$, glass, Al, Ti, C, polymers, or porous materials. Layer of Si provides an intermediate acoustic impedance. Various materials are suitable for the substrate 140, such as Si or SiO$_2$ or glass, sapphire, quartz. Substrate 140 materials can have high electrical resistivity. The substrate can have a thickness appropriate for RF applications, such as integration into mobile phone platforms. For example, the substrate can have a thickness less than 500 microns, or less than 200 microns. For example, Si wafers can be purchased with a thickness of 675 μm and thinned down to a achieve desired device thickness, e.g., for mobile platforms.

Modeling of the acoustic response of LBAW 100 can provide guidance on how to tune the design parameters for individual elements of the structure to achieve desired bandpass properties. For example, LBAW 100 can be designed to have resonance modes at specific frequencies. In general, the geometry of various LBAW 100 components can be selected to achieve various acoustic properties. LBAW 100 properties can depend on the combination of these geometries, which may not be independent of one another.

Figure 2A:
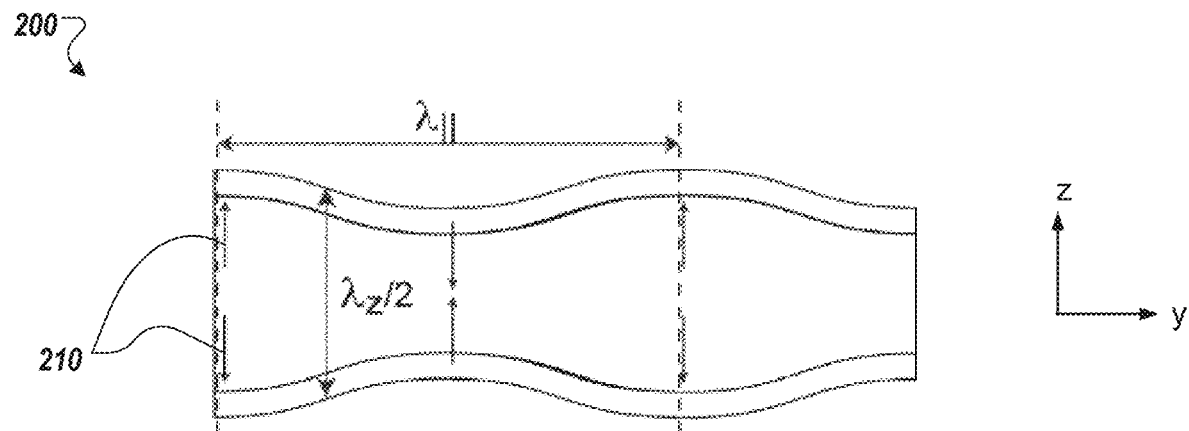
FIGS. 2A-B are schematic diagrams of two types of propagating plate wave modes in LBAW piezo layer.
Figure 2B:
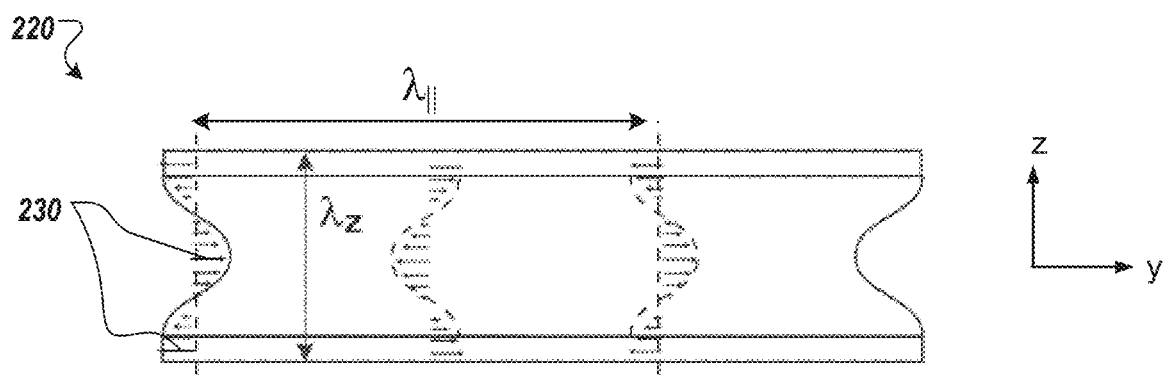

In piezoelectric layer 110, different bulk acoustic vibration modes can arise at different excitation frequencies f of input voltage (e.g., at port 160). Acoustic vibrations in piezo layer 110 can propagate laterally as Lamb waves (or plate waves), wherein particle motion lies in the plane that contains the direction of wave propagation and the plate normal (e.g., the z-axis in FIG. 1A). Two such modes are shown in FIGS. 2A-2B. Referring to FIG. 2A, a thickness-extensional (TE or longitudinal) bulk mode 200 has particle displacement 210 dominantly perpendicular to the propagation direction (in the z-direction). Referring to FIG. 2B, a second order thickness-shear (TS2) bulk mode 220 has particle displacement 230 dominantly parallel to the propagation direction (in the y-direction). For both modes, the lowest frequency at which resonance in the thickness direction can arise is when the thickness d of piezo layer 110 is equal to an integer number of half wavelengths $\lambda_z$ (disregarding the thickness of electrodes 150/170); in other words, when $$d = \frac{N\lambda_z}{2},$$

where N is an integer that indicates the order of the resonance. For the TE1 mode, $$d = \frac{\lambda_z}{2}.$$

As discussed further below, the width W of the electrodes and the gap G between electrodes can be designed such that TE1 mode standing waves with certain lateral wavelengths $\lambda_\parallel$ are formed that can couple through their evanescent tails across gap G to create two mechanical resonant modes.

Figure 3:
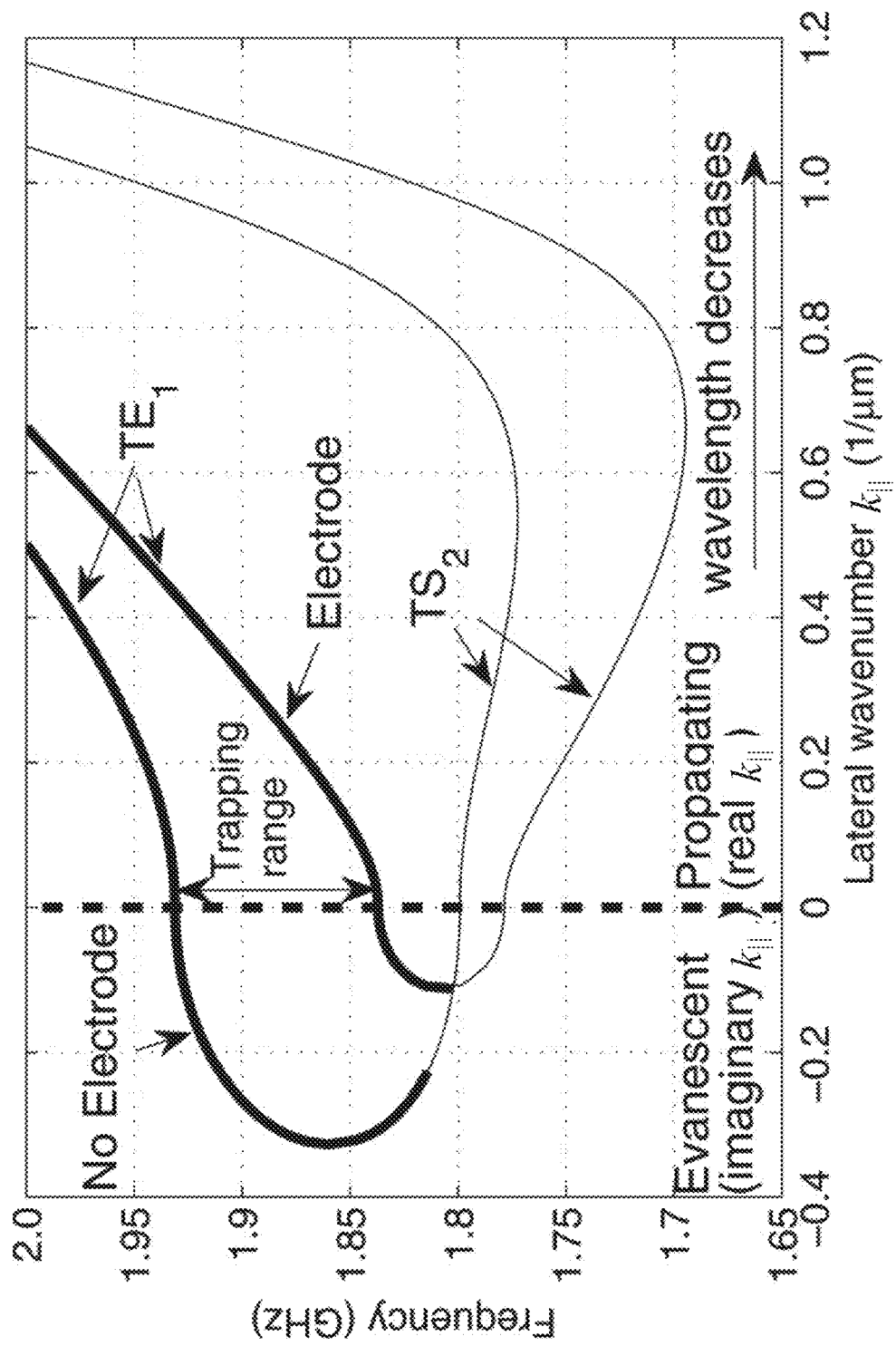
FIG. 3 is a dispersion curves for an exemplary LBAW.

Acoustic properties of an LBAW resonator 100 can be described with dispersion curves. Referring to FIG. 3, an example dispersion curve for an LBAW 100 shows the lateral wave number $k_\parallel$ of the vibration, where $$k_\parallel = \frac{2\pi}{\lambda_\parallel},$$

as a function of frequency f. The first-order longitudinal (thickness extensional, TE1) vibration mode, in which the combined thickness of the piezoelectric layer d and the thickness of electrode(s) 150 or 170 contains approximately half a wavelength of the bulk vibration, $\lambda_z/2$, and the second-order thickness shear (TS2) mode, in which the bulk vibration is dominantly perpendicular to the thickness direction (z-axis in FIG. 2B) and approximately one acoustic wavelength $\lambda_z$ is contained in the combined piezoelectric layer thickness d and the thickness of electrode(s) 150 or 170, are denoted in the figure. The TE1 mode is the darker portion of each dispersion curve, and TS2 mode is the lighter region of each dispersion curve. The top curve ("no electrode") represents the dispersion properties of the piezoelectric layer under the gap 190. The bottom curve ("electrode") represents the dispersion properties of the piezoelectric layer under electrodes 150/170, also known as the active region. More specifically, where the "electrode" curve intersects k=0, the TE1 mode has approximately $\lambda_z/2$ contained in the combined thickness of the electrodes 150 or 170 and the piezoelectric layer. This is approximate because the wave can extend into the Bragg reflector. "No Electrode" curve intersection with k=0 lines shows the modes where approximately $\lambda_z/2$ is contained in the combined thickness of the bottom electrode only and the piezolayer. This type of dispersion, in which the TE1 mode has increasing $k_\parallel$ with increasing frequency f, is called Type 1. The difference in intersect $k_\parallel$=0 frequencies between electrode and non-electrode areas determined the hard limits for the achievable bandwidth of the filter. The gap width G, electrode width W, and number of extensions K can be used to vary the coupling strength within the limits set by the dispersion difference.

In some embodiments, LBAW 100 can be designed to produce Type 1 dispersion. For example, piezo layer 110 materials can be selected in which Type 1 dispersion can occur. For example, ZnO can be used. In another example, appropriate design of acoustic Bragg reflector 130 can help achieve Type 1 dispersion. For example, using Aluminum nitride ("AlN") for piezo layer 110 can typically produce a Type 2 dispersion, where TE1 mode behaves non-monotonically having initially decreasing $k_\parallel$ with increasing frequency f, and then increasing $k_\parallel$ with increasing frequency f, (roughly similar to what is described in the dispersion curves of in FIG. 3 but with TE1 and TS2 interchanged). However, in some embodiments, with an appropriate design of the reflecting structure 130 (e.g., acoustic Bragg reflectors), the LBAW 100 can use AlN in piezo layer 100 and still achieve a Type 1 dispersion. See for example Fattinger et al. "Optimization of acoustic dispersion for high performance thin film BAW resonators," Proc. IEEE International Ultrasonics Symposium, 2005, pp. 1175-1178.

In FIG. 3, positive values of $k\parallel$ denote real wave numbers (propagating waves) and negative $k\parallel$ values correspond to imaginary wave numbers (evanescent waves). For a resonance to arise, the acoustic energy must be trapped inside the LBAW resonator structure. In the thickness (z-axis) direction, isolation from the substrate (using reflecting structure 130) can be used for energy trapping. In the lateral direction, energy trapping can occur when an evanescent wave forms outside the electrode region (e.g., on the "no electrode" curve). To get resonant coupling between the two resonators (e.g., electrodes 150/170 and 120) of an LBAW, standing waves of a TE1 mode form in the active regions of the piezo layer (under the electrodes), and evanescent waves form in the "no electrode" region. In other words, $k\parallel$ is positive for the TE1 "electrode" curve and negative for the TE1 "no electrode" curve. According to FIG. 3, this occurs in the labeled "trapping range" frequency range. Energy trapping can be easier to realize in Type I dispersion. Without wishing to be bound by theory, with monotonically increasing dispersion curves as the thick TE1 lines in FIG. 3, for the "Electrode", at a single frequency in the trapping range there is either a single imaginary wave number available or above the trapping range a single real wave number. The former means that the TE1 does not propagate outside the electrode and the latter that the TE1 can couple to a propagating wave outside the electrode and thus "leak". The Type 2 dispersion can be described by similar curves but with the TE1 and TS2 curves interchanged. The fact that the curve in Type 2 is non-monotonic means that at a given frequency there may be several real wavenumbers. Having several wavenumbers for a frequency means propagating waves are available outside the electrode, which can cause a "leak".

Figure 4A:
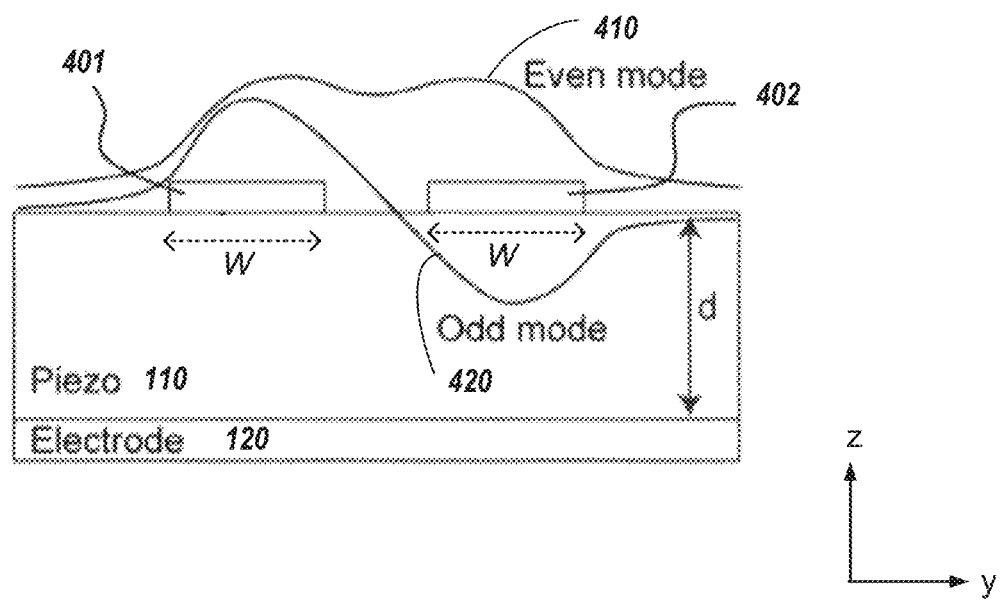
FIG. 4A is a schematic diagram of two resonant modes in an LBAW.
Figure 4B:
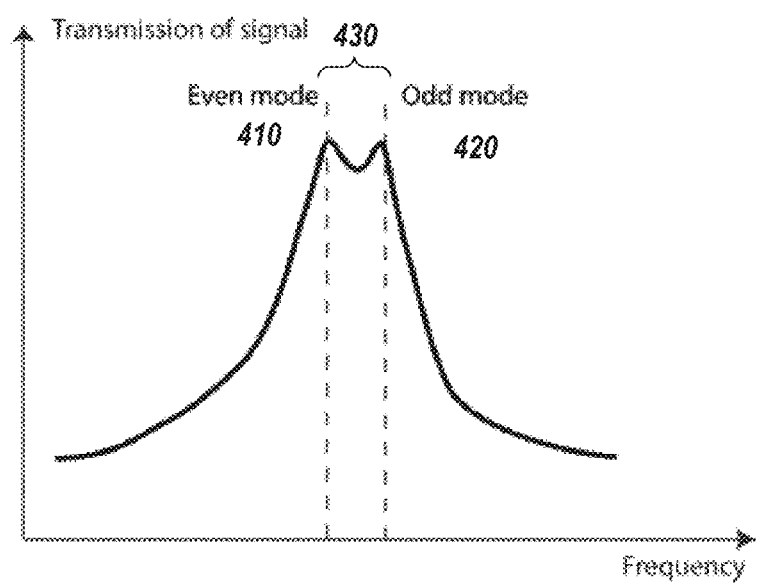
FIG. 4B is an illustrative transmission response of an LBAW as a function of frequency.

FIGS. 4A-4B illustrate the relationship between standing wave resonance modes and the LBAW bandgap. Referring to FIG. 4A, a portion of LBAW 100 includes two adjacent electrodes 401 and 402 with width W (e.g., corresponding to extensions 150*a* and 170*a* of respective electrodes 150 and 170 of FIG. 1A). The bandpass frequency response of LBAW 100 is formed by two or more laterally standing resonance modes, 410 and 420, arising in the structure. Lateral standing wave resonance can arise when plate waves are reflected from edges of the adjacent electrodes 401 and 402. In the even mode resonance 410, the piezo layer under both electrodes 150 and 170 vibrates in-phase, whereas in the odd mode resonance 420, the phases are opposite. The even lateral standing wave resonance can arise when the total width of the structure is roughly equal to half of the lateral wavelength $\lambda_\parallel$ of the mode:

$$\frac{\lambda_{even}}{2} = \frac{\lambda_\parallel}{2} \approx 2 \cdot W + G.$$

In the limit of infinitely small gap width G, $\lambda_{even}$ approaches the total width from below. As shown in FIG. 4A, $\lambda_{even}$ gets smaller when G gets larger and gets larger when G gets larger. In case of small gap (e.g., zero-gap) $\lambda_{even}$ gets close to 4W and in case of a large gap $\lambda_{even}$ gets close to 2W. The odd lateral standing wave resonance can arise when the width of the electrode is roughly equal to half of the lateral wavelength $\lambda_\parallel$ of the mode:

$$\frac{\lambda_{odd}}{2} = \frac{\lambda_\parallel}{2} \approx W.$$

Referring to FIG. 4B, the even 410 and odd 420 modes are shown as transmission peaks as a function of input frequency f for an LBAW with Type 1 dispersion. For Type 1 dispersion, the even mode 410 has a longer wavelength and is lower in frequency than the shorter-wavelength odd mode 420. The frequency difference 430 between the modes determines the achievable bandwidth of LBAW filter 100, and depends on the acoustic properties of the structure and on the dimensions of IDT resonator 102. Acoustic coupling strength can be defined in terms of the (resonance) frequency difference between even (symmetric) and odd (antisymmetric) resonances:

$$\frac{f_{asymm} - f_{symm}}{f_0},$$

where $f_{symm}$ and $f_{asymm}$ are the symmetric and antisymmetric eigenfrequencies, respectively, and $f_0=(f_{symm}+f_{symm})/2$ is the center frequency between the two modes.

In some embodiments, increasing the number of extensions (e.g., 150a and 170a) in each electrode (e.g., 150 and 170) can increase the frequency difference between the even and odd mode in the LBAW, and thus increase the bandwidth. This effect can result from the fact that the lateral wavelength of the odd mode can depend on the periodicity of the electrode structure (e.g., width W), while the even mode can depend on the entire width of the structure (e.g., adding up all widths W and gaps G). For example, if the total number of electrode extensions K, the electrode width is W, and the gap width is G, the wavelength $\lambda_\parallel$ of the lateral acoustic wave at the even mode resonance frequency approaches or is slightly shorter than:

$$\frac{\lambda_{even}}{2} \approx K \cdot W + K \cdot G.$$

The odd lateral standing wave resonance in this structure, however, approaches or is slightly larger than:

$$\frac{\lambda_{odd}}{2} \approx W.$$

Additionally, or alternatively, in some embodiments, the total width of the structure K·W+K·G can be such that the highest-order mode trapped in the structure is the desired odd mode resonance. For example, K can be 31, W can be 3 μm, and G can be 2 μm.

In some embodiments, the number of electrode extensions K is between 2 and 200, or between 10 and 60. In some embodiments, the length L of electrode extensions can be between 50 μm and 2000 μm, or between 70 μm and 500 μm. In some embodiments, the gap G is selected to allow coupling of the evanescent tails of standing waves formed under electrodes 150 and 170. For example, the gap G between electrode extensions can be 0.1 μm and 10 μm, or between 2 μm and 5 μm.

In some embodiments, the topology of the electrodes 150 and 170 can be designed such that the gap width G provides good enough coupling between electrode extensions to create a single even mode 410 across the entire width of the structure. For example, the gap width G can be 2%-300%, or 10%-100% of the evanescent acoustic wave's decay length, i.e. the length at which amplitude $A=A_0 \cdot e^{-1}$ of the original amplitude $A_o$, in the gap at the desired even resonance mode. The gap width G can be optimized. Decreasing the gap to a too small width (1) can eventually pull the even and odd modes too far from each other creating a dip in the passband, (2) can lead to reduced coupling coefficient for the odd mode, or (3) can increase capacitive feedthrough from finger to finger causing poor out of band attenuation.

In some embodiments, the gap width G can be defined with respect to piezo layer thickness d. For example, G can be designed to be 10% to 300% of d, or 25% to 150% of d.

In some embodiments, the width of electrode extensions W can be between 0.1 μm and 30 μm, or between 2 μm and 5 μm. In some embodiments, W can be designed such that the wavelength $\lambda_\parallel$ of the lateral acoustic wave at the desired odd mode resonance frequency $\lambda_{odd}$ is obtained.

In some embodiments, the electrode width W is designed such that multiple half-wavelengths cannot fit within the electrode width. For example, W can be designed to be smaller than the lateral acoustic wave's wavelength $\lambda_\parallel$ at the desired odd resonance mode, e.g., where $\lambda_\parallel = \lambda_{odd}$.

In some embodiments, the thicknesses of various LBAW 100 components can be selected to achieve various acoustic properties and may be interdependent. For example, the piezo layer 110 thickness d (minimum and maximum value) can first be determined with respect to the acoustic wavelength in the piezo material ($\lambda$) at the operation frequency f. In some embodiments, thicknesses (min and max) of the other LBAW 100 layers can be selected based on the choice of piezo thickness d. For example, the combined thickness of the electrodes (including the counter electrode 120) and the piezoelectric layer can be selected to be approximately half a wavelength of the mode that is being used, for example longitudinal bulk wave for the thickness extensional mode. Fundamental modes with N=1 (the first mode, i.e., first harmonic) can allow for greater coupling, but N>1 modes are also possible. For example, the thickness of electrodes 150 and 170, bottom electrode 120, and reflecting structure 130 can be defined as a percentage of piezo layer thickness d. In some embodiments, once all thicknesses are selected, the geometry of the electrode extensions 150a and 170a, such as number K, width W, and length L, can be tuned to match the LBAW 100 electrical impedance to the system impedance. Without wishing to be bound by theory, impedance matching can help avoid losses and reflections in the system.

In some embodiments, thickness of electrodes 150 and 170 is between 1% to 30% of d, or 5% to 25% of d, or 3% to 15% of d.

In some embodiments, the thickness of bottom electrode 120 is between 5% to 50% of d, or 10% to 30% of d, or 10% to 20% of d.

In some embodiments, where the reflecting structure 130 is a Bragg reflector, the alternative layers of the reflector can be designed such that the required reflectivity of passband wavelengths is obtained. For example, the thickness of each layer can be equal to or less or more than one quarter of the acoustic wavelength $\lambda_z$ in the thickness direction to reflect the odd and even TE1 resonance modes. In some embodiments, a single layer in the Bragg reflector can be 15% to 80% of d, or 20% to 70% of d.

The mass loading of the IDT 102, determined by the thickness and material of electrodes 150 and 170, can be designed such that the frequency difference between the $k_\parallel = 0$ frequency of the electrode region's TE1 mode and the outside electrode region's TS2 mode is small. Without wishing to be bound by any particular theory, when the frequency difference between outside region's TS2 mode and electrode region's TE1 mode is small, the trapping range is large. More particularly, the k=0 frequency of the outside region's TS2 mode can be 95%-99% of the electrode region's TE1 cutoff frequency. The frequency difference between the outside region's TS2 and outside region's TE1 modes' $k_∥=0$ frequencies is designed to be large, e.g. 5%-15%, for example 6.5%-7.5%, of the electrode region's TE1 mode cutoff frequency.

According to certain embodiments of the present invention, the $k_∥=0$ frequency of the outside region's TS2 mode is greater than, or equal to 98%, or between 98% and 99.5%, or is 98.9% of the electrode region's TE1 cutoff frequency. Similarly, the frequency distance expressed as the frequency difference between electrode region TE1 and outside region TS2 $k_∥=0$ frequencies:

$$\frac{\text{electrode } TE1 - \text{outside } TS2}{\text{outside } TS2}$$

should be small, for example on the order of 1%. As an example, said frequency distance can be between 0.2% and 2.1%, or between 0.5% and 1.8%, or between 0.8% and 1.5%, or for example, 1.1%.

Figure 5:
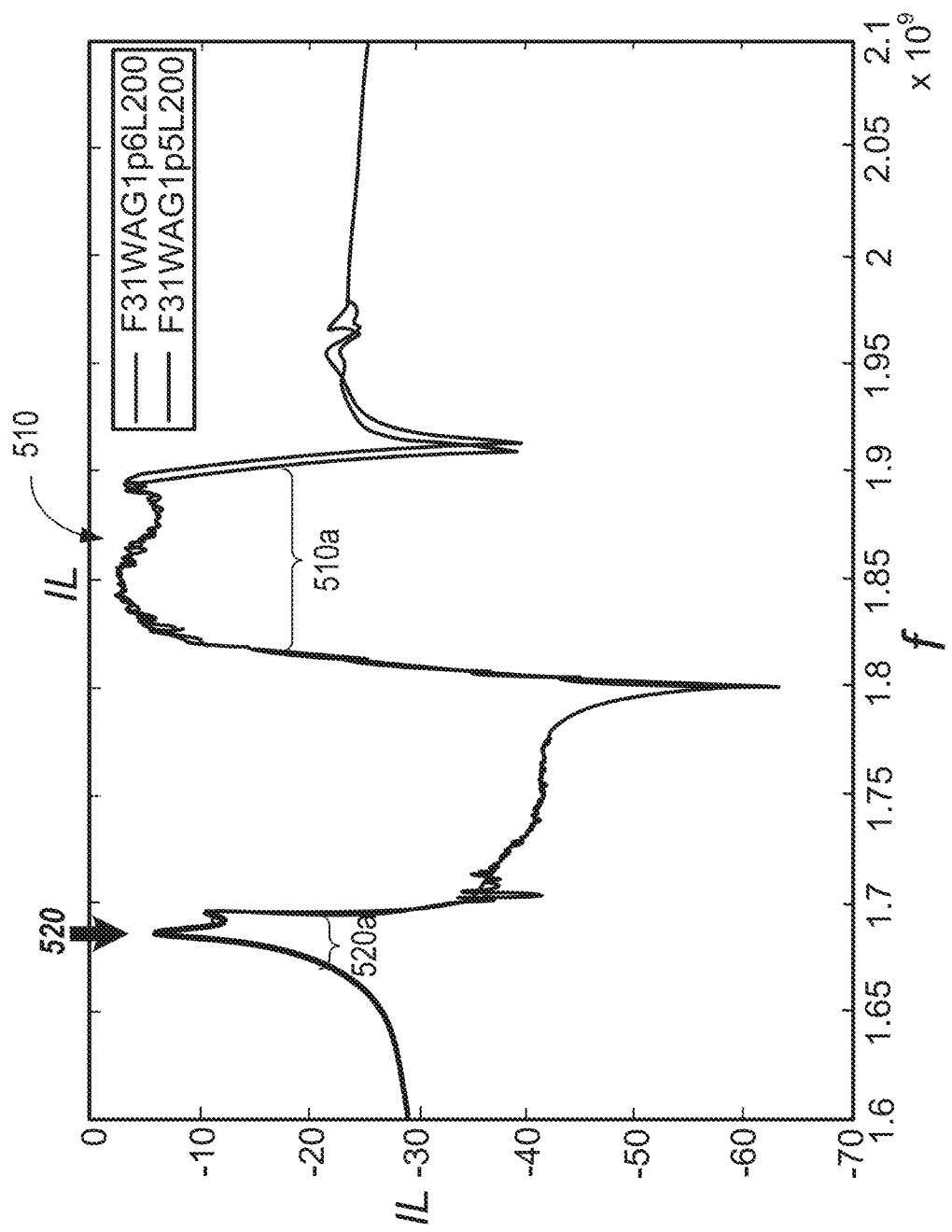
FIG. 5 is an experimental transmission curve of an LBAW as a function of frequency. FIGS.

FIG. 5 shows a curve of insertion loss IL versus frequency f for an exemplary LBAW 100. The curve shows two passbands with peak 510 corresponding to TE1 waves and peak 520 corresponding to TS2 waves. As discussed above, the width of each passband is determined by the frequency difference of the even and odd modes for the respective type of wave. Here, the TS2 modes correspond to sideband 520a (also referred to herein as "TS2 passband"), and the TE1 modes correspond to passband 510a (also referred to herein as "TE1 passband"). In some embodiments, LBAW 100 is designed to suppress peak 520 corresponding to TS2 modes, while maintaining the properties of peak 510 corresponding to TE1 modes. Without wishing to be bound by any particular theory, TE1 mode operation can be selected because piezo thin film materials have electromechanical coupling that is stronger in the thickness direction. In other words, TE1 longitudinal mode vibrations couple more efficiently to the electrical excitation over the thickness of piezo layer 110.

In some embodiments, LBAW 100 can be designed to have a passband for TE1 modes between 0.5 and 10 GHz, or between 1 and 4 GHz. In some examples, TE1 passband is between 1.8 and 3.7 GHz. The limits of the passband can incorporate design considerations. For example, the dimensions of the device can grow very large or very small. Too large dimensions may take too much space and cause inefficiencies. Too small dimensions can deteriorate performance due to thin and narrow electrodes leading to resistance and losses. In some embodiments, LBAW 100 can be designed to have a TE1 passband width 510a of 0.5-15% relative to center frequency, e.g., 10% relative to center frequency, or 5%, or 2%, or 1%. In some embodiments, the insertion loss at the passband is −7 dB to −0.5 dB or −5 dB to −1.5 dB.

Implementations of the present disclosure provides techniques to suppress LBAW sidebands created by TS2 mode. The implementations suppress the sidebands by cascading multiple LBAWs. The cascaded LBAW filters can be designed to have different TS2 resonance frequencies so that insertion loss of one filter suppresses sideband of the other filter.

FIGS. 6A-6D illustrate block diagrams of example filter devices 600 that includes two LBAW filters connected in series. The embodiment 600 includes a first LBAW 100a connected to a second LBAW 100b. Each of the first and the second LBAWs 100a and 100b is structurally similar to LBAW 100 of FIG. 1A or 1B. For example, the first LBAW 100a includes extensions 150a, 170a, and electrodes 150 and 170. The electrodes 150 and 170 of the first LBAW 100a extend substantially in parallel and are separated from each other by a first gap. Similarly, the second LBAW 100b includes extensions 650a, 670a, and electrodes 650 and 670. The electrodes 650 and 670 of the second LBAW 100b extend substantially in parallel and are separated from each other by a second gap.

Electrode 150 is an input electrode and electrode 170 is an output electrode of the first LBAW 100a, and electrode 670 is an input electrode, and electrode 650 is an output electrode of the second LBAW 100b. The first and the second LBAWs 100a and 100b are configured such that application of a radio frequency voltage between an electrode (e.g., electrode 150) of the first LBAW 100a and the first counter electrode 640 creates acoustic thickness-extensional (TE) and acoustic thickness-shear (TS) resonance modes between the electrodes 150 and 170 (e.g., in the first piezoelectric layer) of the first LBAW 100a, and between the electrodes 650 and 670 (e.g., in the second piezoelectric layer) of the second LBAW 100b. Thus, the input electrode 150 of the first LBAW 100a provides the input for the filter device 600, whereas the output electrode 650 of the second LBAW 100b provides the output for the filter device 600. Electrode 170 is electrically coupled with electrode 670. The electrodes 170 and 670 (and connection 660 if present) can form a common floating electrode 602 between the input electrode 150 of the first LBAW 100a and the output electrode 650 of the second LBAW 100b.

Figure 6A:
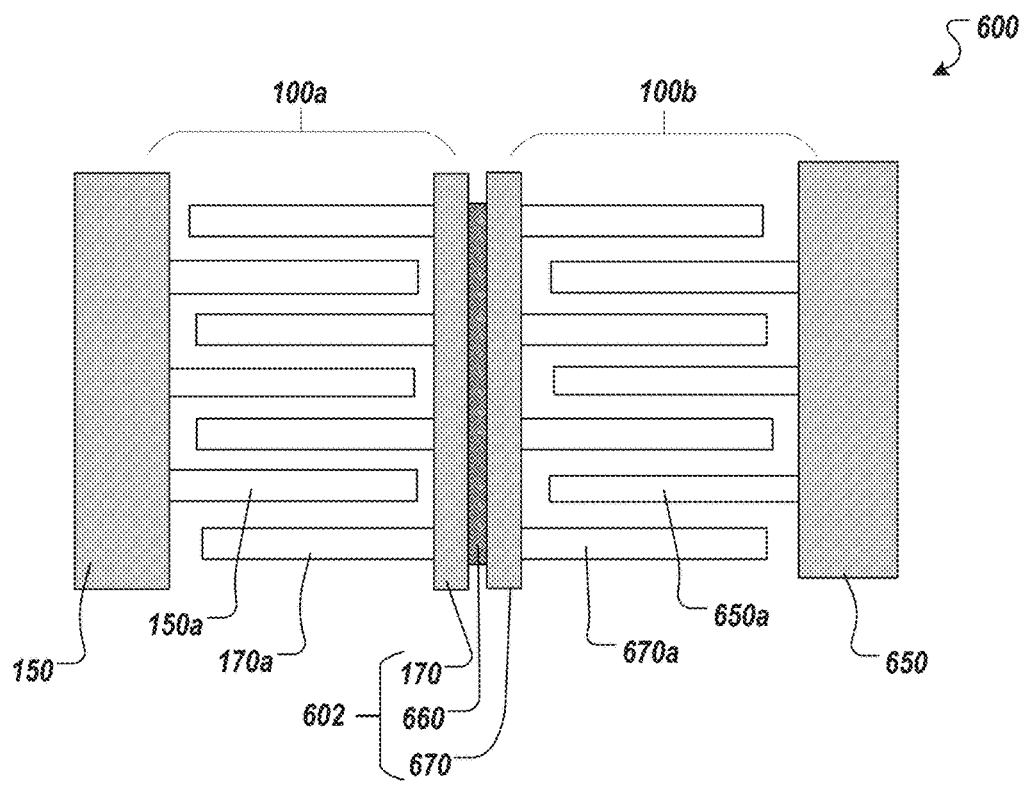
FIG. 6A-6D illustrate block diagrams of example filter devices that includes two example LBAW filters connected in series.

In some embodiments, electrode 170 is connected to electrode 670 through a conductive connector 660. FIGS. 6A and 6C illustrate examples of connection of electrodes 170 and 670 through the conductive connector 660. As shown in FIG. 6A, the conductive connector 660 can be relatively short such that the first and second LBAWs 100a, 100b are basically adjacent, e.g., separated by less than the width of a LBAW device on the substrate, or less than a width of an electrode 170 or 760 (width can be measured along the direction parallel to the long axis of the extensions).

Alternatively, as shown in FIG. 6C, the conductive connector 660 can be an extended conductive body or conductive line, such that the first and second LBAWs 100a, 100b are separated by more than the width of a LBAW device. Although FIG. 6C illustrates the connector 660 as a straight line, this is not required. This permits effectively arbitrary placement of the LBAWs, which may be beneficial for layout of an integrated circuit.

The conductive connector 660 can have up to the same length as the electrodes 170, 670 (measured along the long axis of the electrodes 170, 670, e.g., perpendicular to the long axis of the extensions 170a, 670a). The conductive connector 660 can have a length (again, measured along the long axis of the electrodes 170, 670) that is greater than, less than, or the same as the width W of the extension 170a, 670a. As shown in FIGS. 6A and 6C, the conductive connector 660 can have a length that is greater than the width of the extensions 170a, 670a. Electrodes 170, 670, and the conductive connector 660 together form a common electrode 602.

Figure 6B:
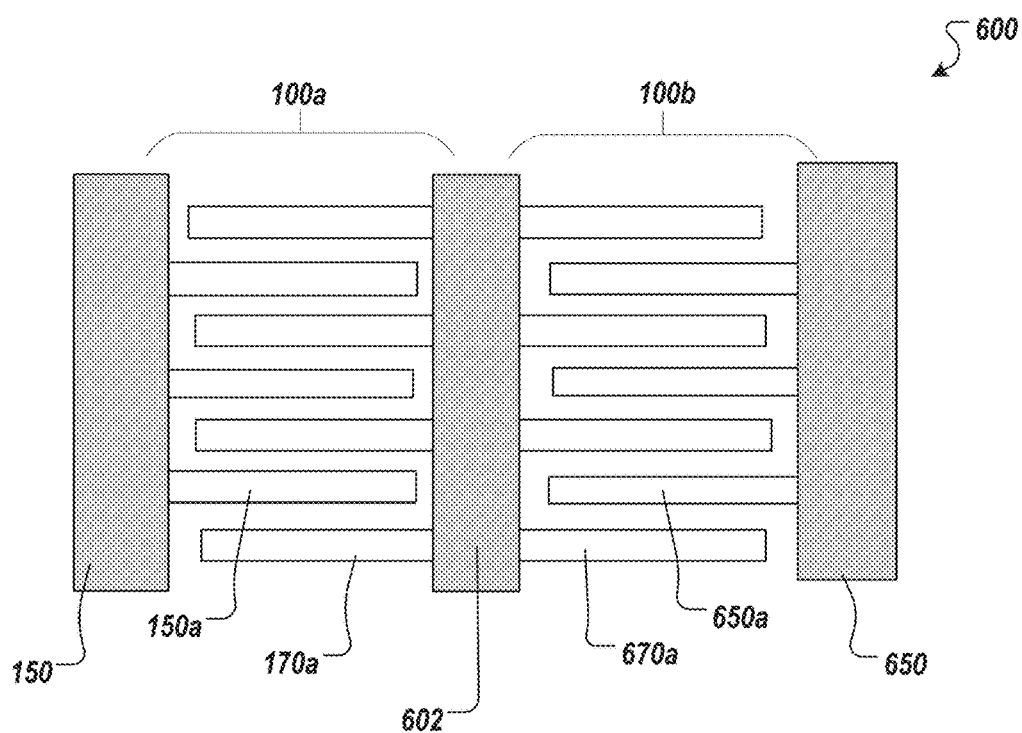
Figure 6C:
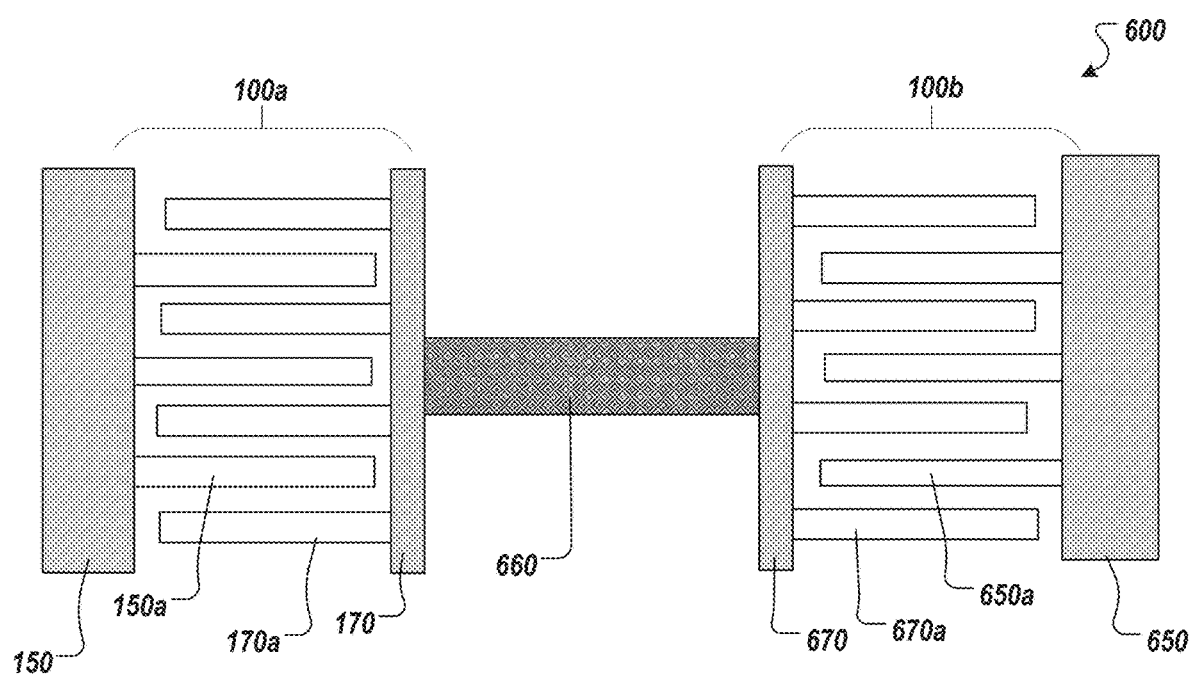

In some embodiments, a filter device may have no conductive connector 660, as depicted in FIG. 6B. In this case, the common electrode 602 depicted in FIG. 6B functions as both electrode 170 of the first LBAW 100a and electrode 670 of the second LBAW 100b. As noted earlier, the common electrode 602 can form a floating electrode between the input electrode 150 of the first LBAW 100a and the output electrode 650 of the second LBAW 100b.

Figure 6D:
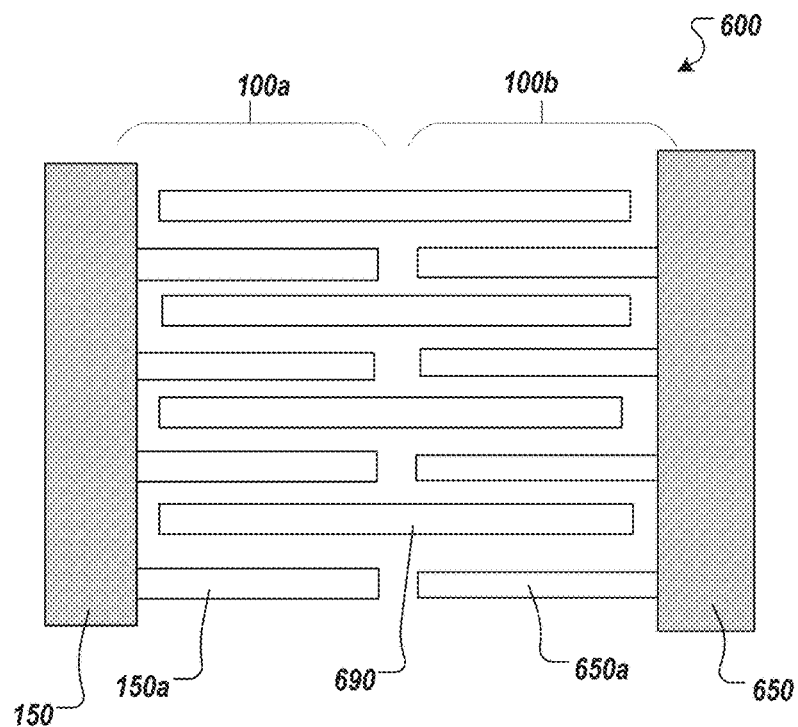

In some embodiments, the common electrode 602 consists of individual fingers; the fingers do not extend from a conductive base and need not be electrically connected. FIG. 6D illustrates an example filter device with multiple common electrodes between its two LBAWs 100a and 100b. The individual fingers 650 can be conductively separated from each other. The fingers can be interdigitated with the extensions (150a, 650a) of the electrodes (150, 650) of the two LBAWs 100a and 100b.

The electrodes 150, 650, and the common electrode 602 (that provide the base of the comb structures) are spaced apart. The electrodes 170, 670, 602 can be rectangular bodies, and can extend substantially in parallel (i.e., their long axes are substantially parallel). Alternatively, electrodes 150 and 170 can be arranged to form an angle greater than zero with respect to electrodes 650 and 670. Two opposing electrodes (as parts of one LBAW or as parts of the common electrode 602) can have similar or different shapes and/or dimensions.

Each of the electrodes 150, 170, 650, 670 includes two or more extensions 150a, 170a, 650a, 670a, respectively. The extensions extend from and are spaced along the length of the respective electrode. The extensions 150a, 170a of the first LBAW 100a may be substantially in parallel (e.g., form an angle less than 5 degrees) to the extensions 650a, 670a of the second LBAW 100b. A first set (or all) of extensions of the first LBAW 100a may be arranged so that the first set of extensions form an angle greater than zero (e.g., greater than 5 degrees) with respect to a second set (or all) of extensions of the second LBAW 100b (i.e., be not in parallel).

In each of the first and the second LBAWs 100a, 100b, each of the extensions can be part of a comb-shape structure extending from the respective electrode. The comb structure that extends from a first electrode (e.g., electrode 150) can be integrated with the comb structure that extends from a second electrode (e.g., electrode 170) that is opposite the first electrode. Each comb structure can include two or more extensions. Extensions of a comb structure can be in parallel with each other. Extensions of two integrated comb structures are separated by a gap. Extensions of a first comb structures can be in parallel with the extensions of a second comb structure that is integrated with the first comb structure. For examples, extensions 670a can be in parallel with extensions 650a of the second LBAW 100b.

The two LBAWs 100a, 100b, can have the same or different number of extensions (e.g., K can be the same for both LBAWs). For example, as shown in FIGS. 6A-6C, the comb structures associated with electrodes 170 and 670 have the same number of extensions, and the comb structures associated with electrodes 150 and 650 in FIGS. 6A-6C have the same number of extensions, so that the total number of extensions is the same for both LBAWs 100a, 100b.

Two interdigitated comb structures within an LBAW can have the same or different number of extensions. For example, as shown in FIG. 6A, the comb structure associated with electrode 150 has a different number of extensions from the comb structure associated with electrode 170.

Rather than two comb structures, a filter device may include a first electrode that provides a comb structure with multiple extensions, and a second electrode that includes a single bar-shaped conductive body (e.g., a single extension) extending between the extensions of the comb. The comb structure is integrated by the bar extension.

The electrodes 150, 170, 650, 670 can be composed of the same or different materials. The extensions 150a, 170a, 650a, 670a can be composed of the same or different materials. One or more electrodes and one or more extensions can be composed of the same or different materials. In some examples, the extensions and the electrodes are composed of one or more metals, such as aluminum (Al).

Figure 6E:
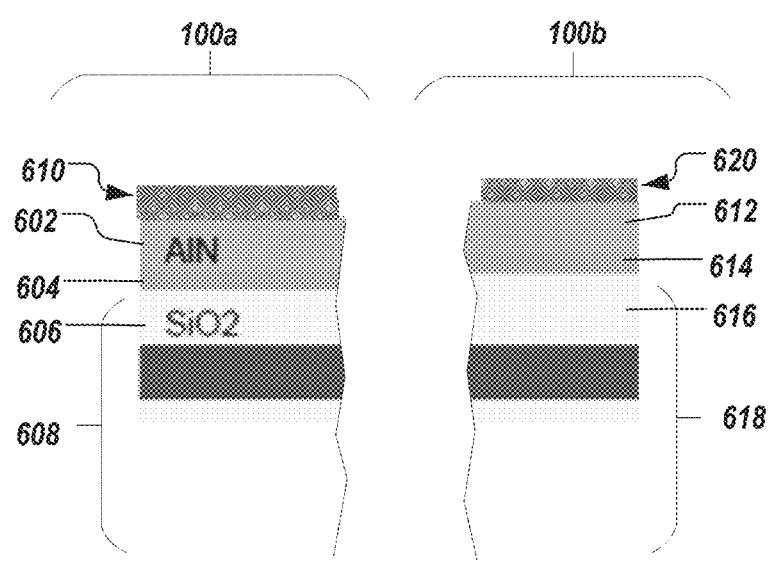
FIG. 6E illustrates part of a cross sectional view of the filter device illustrated in FIG. 6A.

FIG. 6E illustrates a cross sectional view of the filter device 600 illustrated in FIG. 6A. The implementations of FIGS. 6B-6D would have a similar cross sectional structure. For simplification, only portions of the filter device 600 are depicted in FIG. 6E.

The first LBAW 100a includes a first acoustic reflector 608, a first intermediary layer 606, e.g., a first dielectric layer, on top of (and that in some implementations forms part of) the first acoustic reflector 608, a first counter electrode 604 on top of the first intermediary layer 606, a first piezoelectric layer 602 on top of the first counter electrode 604, and one or more first conductive layers 610 on top of the first piezo electric layer 602. The one or more first conductive layers 610 form the electrodes 150, 170, and the extensions 150a, 170a.

Similarly, the second LBAW 100b includes a second acoustic reflector 618, second intermediary layer 616, e.g., a second dielectric layer, on top of (and that in some implementations forms part of) the second acoustic reflector 618, a second counter electrode 614 on top of the second intermediary layer 616, a second piezoelectric layer 612 on top of the second counter electrode 614, and one or more second conductive layers 620 on top of the second piezoelectric layer 612. The one or more second conductive layers 620 form the electrodes 650, 670, and the extensions 650a and 670a. In some implementations, the first and the second intermediary layers 606 and 616 can be conductive layers. Such conductive layers can be made of aluminum.

The first and/or the second intermediary layers can be two regions of an intermediary layer. The intermediary layer can be the topmost layer of the acoustic reflector 608 or can be positioned on top of the topmost layer of the acoustic reflector. The two regions that include the first and the second intermediary layers can have different thicknesses. The acoustic reflector 608 can have one or more layers. The topmost layer of the acoustic reflector 608 is a layer that is closest to the counter electrode from among the layers of the acoustic reflector 608.

In some embodiments, the first and/or the second reflector is a Bragg mirror. The first and the second reflectors 608 and 618 can be parts of a common reflector shared between the first and the second LBAWs 100a and 100b. The first and the second piezoelectric layers 602 and 612 can be parts of a common piezoelectric layer shared between the first and the second LBAWs 100a and 100b.

Cascaded LBAWs can be utilized to suppress spurious sidebands created by TS modes. For example, embodiment 600 may have a sideband that is a result of sidebands of the first and the second LBAWs 100a and 100b. The first LBAW 100a and/or the second LBAW 100b can be utilized to suppress the sideband of embodiment 600 to have a lower signal transmission compared to the individual ones of LBAW 100a and 100b.

Resonance frequencies corresponding to TE1 mode ($f_{TE1}$) and Resonance frequency corresponding to TS2 mode ($f_{TS2}$) of an LBAW depend on geometry and characteristics of the layers of the LBAW. The resonance frequency ratio $f_{TE1}/f_{TS2}$ of an LBAW is a function of the Poisson ratio of the materials used in the LBAW. The Poisson ratio of a multilayer structure with a stack of two materials A and B is a function of $t_A/t_B$, where $t_A$ is thickness of a layer composed of material A, and $t_B$ is thickness of a layer composed of material B. Accordingly, resonance frequency ratio $f^{TE1}/f_{TS2}$ of an LBAW depends on thickness of the LBAW's layers with respect to each other and can be adjusted by changing thickness of one or more layers of the LBAW. For example, resonance frequency ratio of an LBAW can be adjusted by changing thickness of dielectric layer, piezo layer, etc. of the LBAW. Thus, the two LBAWs 100a, 100b can have different resonance frequencies by providing them with dielectric layers of different thicknesses.

The first and the second intermediary layer 606, 616 can be composed of the same material, e.g., silicon oxide (SiO2), silicon nitride (SiN), etc. However, as described further below, the first and the second intermediary layer 606, 616 can have different thicknesses.

In the example embodiments depicted in FIGS. 6A-6E, other than as described below (e.g., for the intermediary layers 606, 616), the second LBAW 100b can have layers identical to the layers of the first LBAW 100a (e.g., layers with identical thicknesses and materials).

To tune TS2 resonance frequency of the first LBAW 100a, the second intermediary layer 616 can be thicker (or thinner) than the first intermediary layer 606. In some embodiments, thickening the second intermediary layer 616 causes resonance frequency ratio $f_{TE1}/f_{TS2}$ of the second LBAW 100b to increase while the absolute values $f_{TE1}$ and $f_{TS2}$ are both decreased. The thickness change of the intermediary layer also causes a shift in TS2 resonance frequency which is larger than the change in TE1 resonance frequency. For example, thickening the second intermediary layer lowers the TS2 resonance frequency, and thinning the second intermediary layer increases the TS2 resonance frequency of the second LBAW 100b.

In the present disclosure, the two intermediary layers are fabricated so that one intermediary layer is thicker than the other intermediary layer. For example, the intermediary dielectric layer 616 can be thicker than the first intermediary layer 606 (as shown in FIG. 6E), or vice versa. For example, one intermediary layer, e.g., one dielectric layer, can be fabricated as the thicker layer by depositing more material on the acoustic reflector compared to the other layer, and/or by thinning down the other intermediary layer (e.g., by etching) more than the one intermediary layer.

Figure 7A:
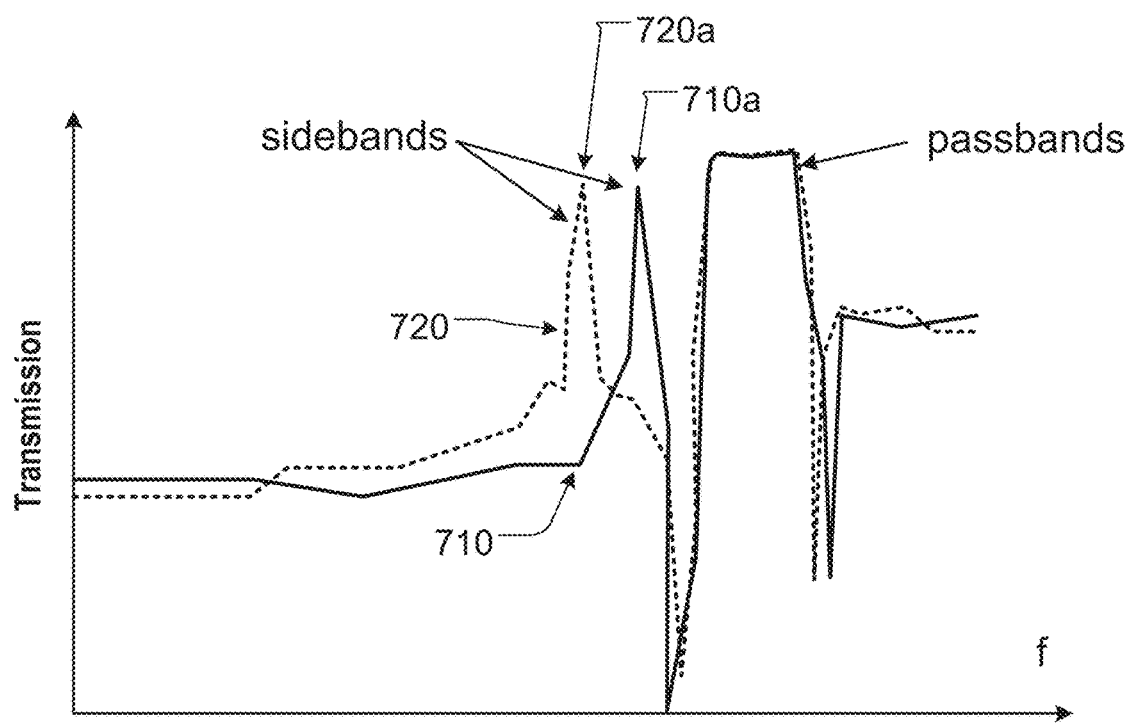
FIG. 7A depicts transmission curves of two individual example LBAWs.

FIG. 7A depicts transmission curves of two individual example LBAWs. The two individual LBAWs can be the first LBAW 100a and the second LBAW 100b with a second dielectric layer 616 thicker than the first dielectric layer 606. As illustrated, FIG. 7A includes a first transmission curve 710 associated with the first LBAW 100a, and a second transmission curve 720 associated with the second LBAW 100b. The first transmission curve 710 includes a first sideband with a first peak 710a. The second transmission curve 720 includes a second sideband with a second peak 720a. Due to the second dielectric layer 616 being thicker than the first dielectric layer 606, the second sideband has shifted compared to the first sideband. Accordingly, the second peak 720a is at a lower frequency compared to the first peak 710a. Because of the difference in the sidebands of the two LBAWs 100a and 100b, when the two LBAWs are cascaded (e.g., as depicted in filter device 600), the overall sideband of the cascaded embodiment is suppressed and has a lower sideband peak compared to each individual ones of LBAWs 100a and 100b.

Figure 7B:
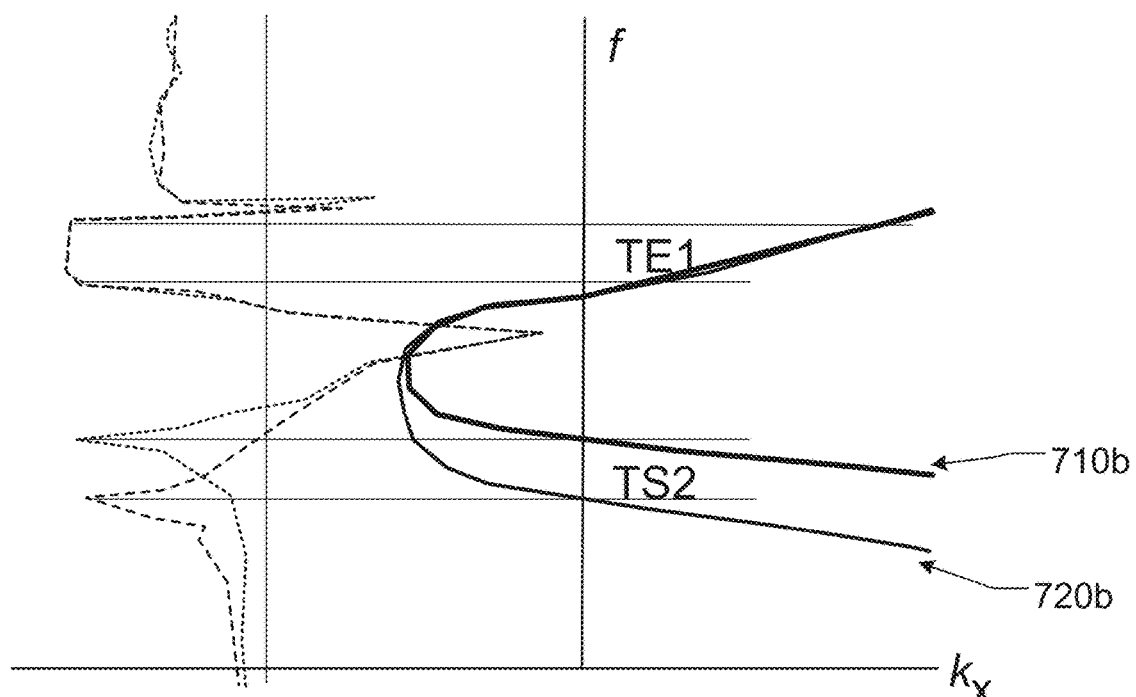
FIG. 7B depicts dispersion curves of the two individual example LBAWs of FIG. 7A.

FIG. 7B depicts dispersion curves of the two individual example LBAWs of FIG. 7A. Dispersion curve 710b is associated with the first LBAW 100a, and dispersion curve 720b is associated with the second LBAW 100b with a thicker dielectric layer (e.g., thicker second dielectric layer 616). As explained with reference to FIG. 3, the upper portions of the curves are related to TE1 modes and the lower portions are related to TS2 modes of the two LBAWs. A thicker second dielectric layer 616 increases the frequency ratio $f_{TE1}/f_{TS2}$ of the second LBAW 100b, causing an increase in the distance between TE1 and TS2 resonance frequencies of the second LBAW 100b as compared to resonance frequency differences in the first LBAW 100a. With substantially similar TE1 passbands (e.g., close frequency cutoffs), the increase in the distance between TE1 and TE2 resonance frequencies cause a suppression in signal transmission in the sidebands, while keeping the passband almost intact.

Figure 7C:
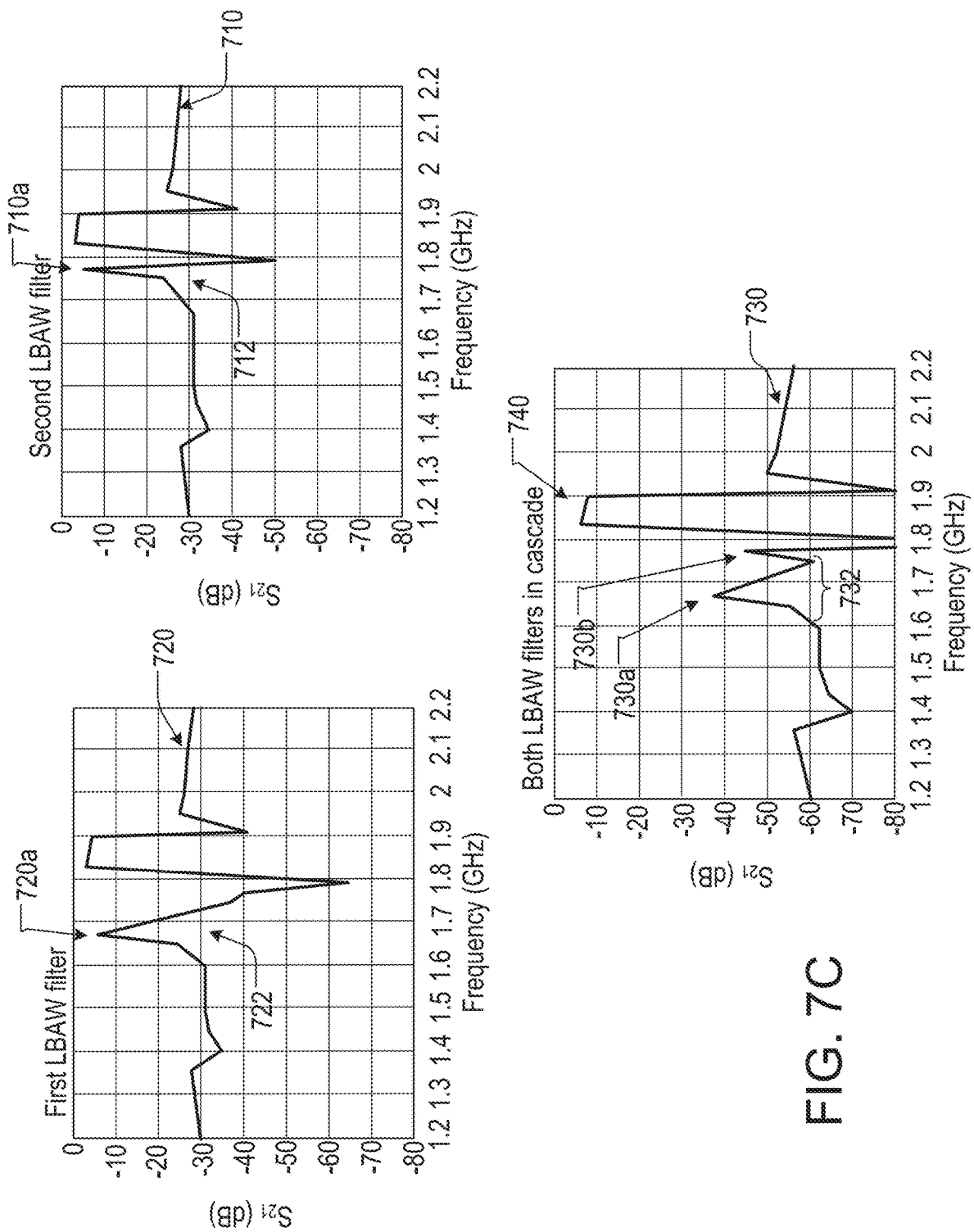
FIG. 7C depicts transmission curve of an example filter device with cascaded LBAWs.

FIG. 7C depicts transmission curve of an example filter device with cascaded LBAWs. The cascaded LBAWs can be the first LBAW 100a and the second LBAW 100b with a second dielectric layer 616 thicker than the first dielectric layer 606. Similar to FIG. 7A, FIG. 7C includes a first transmission curve 710 associated with the first LBAW 100a as measured individually, and a second transmission curve 720 associated with the second LBAW 100b as measured individually. A third transmission curve 730 represents transmission of the filter device 600, where the first and the second LBAWs 100a and 100b are cascaded.

As illustrated, the sideband 732 of the cascaded LBAWs is suppressed compared to the passband 740. In particular, the sideband 732 can have more than 30 dB loss, whereas the passband is less than 10 dB loss. Similarly, the sideband 732 of the cascaded LBAWs is suppressed compared to each of the sidebands 712 and 722 associated with the individual LBAWs; the sideband peaks 730a, 730b of the cascaded LBAWs are smaller than each peaks 710a and 720a of the individual LBAWs. The sideband peaks can be suppressed more than 20 dB, or even more than 30 dB by cascading LBAWs according to the present disclosure.

As explained above, the second intermediary layer 616 can be thicker or thinner than the first dielectric layer 606. In the example depicted in FIG. 6E, the second intermediary layer 616 is thicker than the first intermediary layer 606. In some embodiments, the second intermediary layer thickness is 1% to 10%, e.g., 2% to 7% greater than the first intermediary layer thickness. In some embodiments, thickness of the thinner intermediary, e.g., dielectric, layer ranges between 900 nm and 1100 nm, and thickness of the thicker intermediary, e.g., dielectric, layer ranges between 1000 nm and 1200 nm. In some examples, thickness of the thinner intermediary, e.g., dielectric, layer ranges between 1000 nm and 1050 nm, and thickness of the thicker intermediary, e.g., dielectric, layer ranges between 1050 nm and 1100 nm.

In some embodiments, the thickness difference of the two intermediary layers 606 and 616 causes a 1 to 10% difference between the resonance frequencies of TS2 modes (i.e., frequencies of the sideband peaks 710a and 720a) of the two LBAWs 100a and 100b. A 2 to 7% thickness difference between the two intermediary layers can cause a 1 to 6% change in TS2 frequency. For example, a 2% thickness difference can provide 1 to 2% change in TS2 frequency; a 5% thickness difference can provide 2 to 4% change in TS2 frequency; a 7% thickness difference can provide 4 to 6% change in TS2 frequency; and a 10% thickness difference can provide 6 to 8% change in TS2 frequency. In some examples, the resulted difference between the resonance frequencies of the TS2 modes is at least 20 MHz, e.g., at least 50 MHz. In some examples, the resulted difference between the resonance frequencies of the TS2 modes can be between 50 to 200 MHz.

To make sure that the TE1 passband of the second LBAW 100b is not suppressed as a result of changing thickness of one or more layers, the TE1 resonance frequency of the second LBAW 100b can be tuned to be substantially close to (e.g., within 1% from, e.g., within 20 MHz, e.g., within 10 MHz from) the TE1 resonance frequency of the first LBAW 100a. Tuning the TE1 resonance frequency can be achieved by selecting dimensions of one or more of the second (or the first) conductive layers 620, the counter electrode 614, and/or the piezoelectric layer 612. For example, the thickness of the extensions of the second (or the first) LBAW 100b. For example, thickness of the extensions 650a, 670a, and/or the electrode 650, 670 can be adjusted by deposition or etching processes. A thicker conductive layer provides a lower resonance frequency, and a thinner conductive layer provides a higher resonance frequency.

In the example embodiment depicted in FIG. 6E, extensions 650a, 670a can be thinner (e.g., be thinned) than the extensions 150a, 170a (or extensions of the two LBAWs 100a and 100b can be deposited with different thicknesses). The width and length of the extensions are measured along axes parallel to the piezo layer (with the width being the dimension along which the extensions are interdigited), whereas the thickness of the extension is measured along the axis perpendicular to the piezo layer. Therefore, by adjusting the thickness of multiple layers of one or more cascaded LBAWs, spurious sidebands can be suppressed with a minimum (or little) effect on the passband. In some embodiments thickness of the extensions can be between 100 nm to 300 nm. The thicker extensions can be up to 20% thicker than the thinner extensions. For example, the thicker extensions 150a may have thickness of 200 to 220 nm and the thinner extensions 650a may have thickness of 180 to 200 nm. The thicker extensions can be about 10% (e.g., less than %13) thicker than the thinner extensions. In some embodiments, the thickness of one or both electrodes 150, 170 can be adjusted to be greater than the thickness of one or both electrodes 650, 670, to tune the TE1 modes of LBAWs 100a and 100b. For example, thickness of the electrodes 650, 670 may be 5% to 20% smaller than the thickness of electrodes 150, 170.

Further, TE1 resonance frequencies can be tuned by selecting appropriate IDT geometries, such as width of the extensions, gap between the extensions, or the number of extensions of at least one of the LBAWs. For example, when the second dielectric layer 616 is thicker than the first dielectric layer 606, the extension width and/or gap between the extensions in the second LBAW 100b can be selected to be lower than the respective parts in the first LBAW 100a to tune TE1 passband of the two LBAWs. The thinner extension widths can range between 1 to 7 µm. The thicker extension width can range between 3 to 10 µm. In some examples, the thinner extension width ranges between 3 to 5 µm and the thicker extension width ranges between 4 to 6 µm. The thinner gap between the extensions can range between 0.5 to 2 µm. The thicker gap between the extensions can range between 1 µm to 3 µm. In some examples, the thinner gap between the extensions ranges between 0.5 µm and 1.75 µm, and the thicker gap between the extensions ranges between 1.5 µm to 3 µm.

In some embodiments, to adjust the TE1 passbands of the two LBAWs 100a and 100b, the number of extensions of the two LBAWs differ from each other.

A number of implementations have been described. Nevertheless, it will be understood that various modifications may be made without departing from the spirit and scope of disclosure. Accordingly, other implementations are within the scope of the following claims.

What is claimed is:

1. An acoustic wave filter device comprising:
a first electrode comprising a first input electrode and a first output electrode;
a second electrode comprising a second input electrode and a second output electrode, the second input electrode being electrically connected to the first output electrode;
a piezoelectric layer beneath the first electrode and the second electrode;
a counter electrode beneath the piezoelectric layer;
an intermediary layer beneath the counter electrode, the intermediary layer comprising a first region and a second region, the first region having a first layer thickness and the second region having a second layer thickness different from the first layer thickness; and
an acoustic reflector beneath the intermediary layer, the acoustic reflector comprising one or more layers,
wherein the first electrode is located over the first region of the intermediary layer, and the second electrode is located over the second region of the intermediary layer, and
wherein the filter device is configured such that application of a radio frequency voltage between the first input electrode and the counter electrode creates acoustic resonance modes in the piezoelectric layer between the first input and output electrodes and between the second input and output electrodes.

2. The device of claim 1, wherein the second layer thickness is greater than the first layer thickness.

3. The device of claim 1, wherein the radio frequency voltage between the first input electrode and the counter electrode creates second-order acoustic thickness-shear (TS2) resonance mode in the piezoelectric layer between the first input and output electrodes and between the second input and output electrodes, and
wherein the second layer thickness is different than the first layer thickness so that a first resonance frequency of TS2 resonance mode created between the first input and output electrodes of the first electrode differs from a second resonance frequency of TS2 resonance mode created between the second input and output electrodes of the second electrode.

4. The device of claim 3, wherein the first resonance frequency differs by 1% to 8% from the second resonance frequency.

5. The device of claim 3, wherein the first resonance frequency differs from the second resonance frequency by at least 50 MHz.

6. The device of claim 1, wherein the second layer thickness is 1% to 10% greater than the first layer thickness.

7. The device of claim 1, wherein the second electrode has a second thickness that is less than a first thickness of the first electrode.

8. The device of claim 7, wherein the second thickness is 1% to 10% thinner than the first thickness.

9. The device of claim 1, wherein each of the first input and output electrodes has multiple first extensions, the multiple first extensions of the first input electrode are interdigitated with the multiple first extensions of the first output electrode, and each of the second input and output electrodes has multiple second extensions, the multiple second extensions of the second input electrode are interdigitated with the multiple second extensions of the second output electrode.

10. The device of claim 9, wherein each of the first input and output electrodes is a comb structure having the multiple first extensions and wherein each of the second input and output electrodes is a comb structure having the multiple second extensions.

11. The device of claim 9, wherein the multiple first extensions are thicker than the multiple second extensions.

12. The device of claim 11, wherein a second extension in the multiple second extensions has a thickness that is 5% to 20% smaller than a thickness of a first extension in the multiple first extensions.

13. The device of claim 9, wherein the multiple second extensions have a second extension thickness that is greater than a first extension thickness of the multiple first extensions so that a first resonance frequency of TE1 resonance mode created between the first input and output electrodes is within 1% from a second resonance frequency of TE1 resonance mode created between the second input and output electrodes.

14. The device of claim 11, wherein the multiple second extensions are substantially parallel to the multiple first extensions.

15. The device of claim 11, wherein the multiple second extensions form an angle greater than zero with respect to the multiple first extensions.

16. The device of claim 1, wherein the first output electrode and the second input electrode are parts of a common electrode shared between the first electrode and the second electrode.

17. The device of claim 1, wherein the first output electrode is connected to the second input electrode through a conductive connector.

18. The device of claim 17, wherein the conductive connector has a length extending parallel to a long axis of extensions extending from at least one of the first input or output electrodes or the second input or output electrodes, the length being greater than a width of the extensions measured perpendicular to the long axis of the extensions.

19. The device of claim 1, wherein the first output electrode is substantially parallel to the second input electrode.

20. An acoustic wave filter device comprising:
a first electrode comprising a first input electrode and a first output electrode;
a second electrode comprising a second input electrode and a second output electrode, the second input electrode being electrically connected to the first output electrode;
a piezoelectric layer beneath the first electrode and the second electrode;
a counter electrode beneath the piezoelectric layer;
an intermediary layer beneath the counter electrode, the intermediary layer comprising a first region and a second region, the first region having a first layer thickness and the second region having a second layer thickness different from the first layer thickness; and
an acoustic reflector beneath the intermediary layer, the acoustic reflector comprising one or more layers,
wherein the first electrode is located over the first region of the intermediary layer, and the second electrode is located over the second region of the intermediary layer, and
wherein the filter device is configured such that application of a radio frequency voltage between the first input electrode and the counter electrode creates one or more acoustic thickness-extensional resonance modes in the piezoelectric layer between the first input and output electrodes and between the second input and output electrodes.

* * * * *